United States Patent
Gambin et al.

(10) Patent No.: US 7,084,040 B2
(45) Date of Patent: Aug. 1, 2006

(54) METHOD FOR GROWTH OF GROUP III–V SEMICONDUCTOR MATERIAL ON A DIELECTRIC

(75) Inventors: Vincent Gambin, Torrance, CA (US); Donald J. Sawdai, Redondo Beach, CA (US)

(73) Assignee: Northrop Grumman Corp., Los Angeles, CA (US)

( * ) Notice: Subject to any disclaimer, the term of this patent is extended or adjusted under 35 U.S.C. 154(b) by 0 days.

(21) Appl. No.: 10/830,729

(22) Filed: Apr. 23, 2004

(65) Prior Publication Data

US 2005/0239274 A1    Oct. 27, 2005

(51) Int. Cl.
*H01L 21/331*    (2006.01)

(52) U.S. Cl. ...................... 438/312; 438/343
(58) Field of Classification Search ................ 438/312, 438/318, 319, 343, 349
See application file for complete search history.

(56) References Cited

U.S. PATENT DOCUMENTS

| | | | |
|---|---|---|---|
| 4,225,409 A | | 9/1980 | Minomura |
| 4,296,424 A | * | 10/1981 | Shibasaki et al. .......... 338/32 R |
| 5,273,930 A | * | 12/1993 | Steele et al. ................ 438/312 |
| 5,726,462 A | * | 3/1998 | Spahn et al. .................. 257/76 |
| 2001/0004488 A1 | | 6/2001 | Morita |
| 2003/0156610 A1 | | 8/2003 | Kwon |

FOREIGN PATENT DOCUMENTS

EP    1 220 333 A2    7/2002

* cited by examiner

*Primary Examiner*—David Vu
(74) *Attorney, Agent, or Firm*—Tarolli, Sundheim Covell & Tummino LLP

(57) ABSTRACT

Formation of a regrowth layer of a Group III–V semiconductor material is facilitated by prior formation of an intermediate layer, selected primarily for its smooth morphology properties. The intermediate layer is formed over an underlying substrate and over a dielectric layer formed over portions of the substrate. The intermediate layer maintains the monocrystalline properties of the underlying substrate in regions other than those covered by the dielectric layer, and improves the electrical and morphology properties of the regrowth layer formed over the intermediate layer.

6 Claims, 1 Drawing Sheet

METHOD FOR GROWTH OF GROUP III-V SEMICONDUCTOR MATERIAL ON A DIELECTRIC

This invention was made with Government support under Contract No. N00014-02-C-0473 awarded by the Department of Defense. The Government has certain rights in this invention.

BACKGROUND OF THE INVENTION

This invention relates generally to semiconductor fabrication techniques and, more particularly, to a technique for regrowth of certain semiconductor materials over a structure that includes a dielectric material. Dielectrics are used in many applications of semiconductors, to maintain electrical separation between conducting and metallic regions of semiconductor structures. When the semiconductor materials are silicon based, there is little difficulty in growing such materials over structures that include dielectrics. Polycrystalline silicon is inherently conducting and forms a desirably low-resistance contact with other regions of a semiconductor structure.

Unfortunately, the same advantages are not inherent to the class of semiconductor materials generally referred to as Group III-V materials, i.e., those semiconductor materials falling into Groups III and V of the periodic table of elements. These materials, such as indium phosphide (InP) and gallium arsenide (GaAs), are the semiconductors of choice for high-speed electronic and optoelectronic applications. Group III-V semiconductors grown over dielectrics are, for the most part, inherently non-conducting. In those regions where a regrown layer overlaps a semiconductor region, the electrical properties result in an undesirably high resistance between the underlying semiconductor region and the regrown layer. Regrown group III-V semiconductor materials also typically have an undesirable morphology. Specifically, some classes of regrown Group III-V semiconductors present a surface that is so rough as to inhibit processing, although, in general, they are relatively good conductors. Other classes of Group III-V semiconductors are smoother, rendering them easier to process, but these are generally less conducting.

Accordingly, there is a need in the semiconductor fabrication art for a technique that facilitates the regrowth of Group III-V semiconductor materials over a structure that includes dielectrics, and that provides good electrical contact with underlying semiconductor regions. The present invention meets this need.

SUMMARY OF THE INVENTION

The present invention resides in a method for improving the electrical and morphology properties of a regrowth layer of Group III-V semiconductor material. Briefly, and in general terms, the invention comprises the steps of forming a substrate; forming a dielectric layer over at least one selected portion of the substrate; forming an intermediate layer over the dielectric layer and the still exposed portions of the substrate, wherein the intermediate layer is selected for its smooth morphology properties; and forming a Group III-V regrowth layer over the intermediate layer.

The step of forming an intermediate layer preferably comprises selecting a Group III-V semiconductor material for the intermediate layer. More specifically, the intermediate layer may be selected from materials such as indium gallium arsenide (InGaAs), indium arsenide (InAs), gallium antimonide (GaSb) and indium antimonide (InSb).

In an embodiment of the invention disclosed by way of example, the Group III-V regrowth layer is of p-type indium antimonide (InSb), and the steps of forming semiconductor layers are effected by molecular beam epitaxy (MBE).

It will be appreciated from the foregoing summary that the present invention provides a significant advance in semiconductor fabrication field. Specifically, the invention facilitates the regrowth of Group III-V semiconductor materials over a semiconductor structure that includes some regions in which a dielectric layer is formed. Other aspects and advantages of the invention will become apparent from the following more detailed description, taken in conjunction with the accompanying drawing.

DETAILED DESCRIPTION OF THE INVENTION

Figure 1:
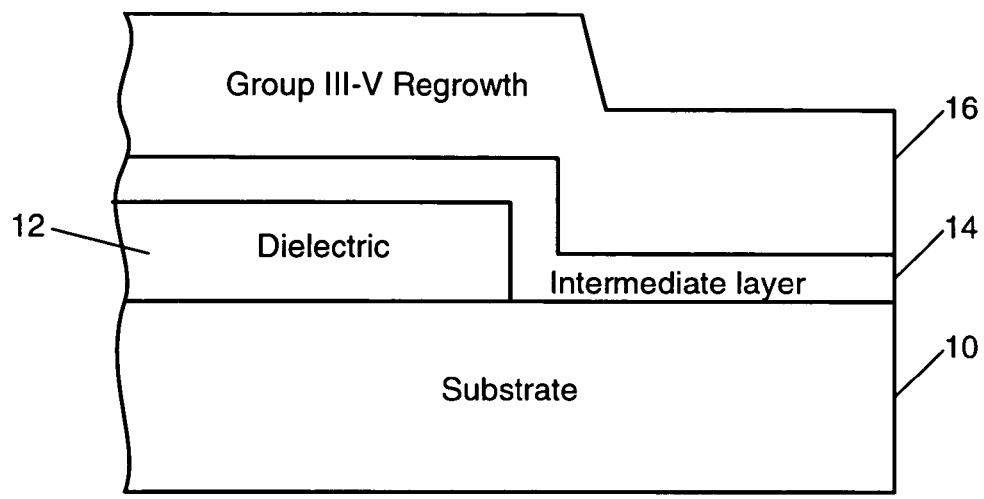
FIG. 1 is a diagram showing the cross section of a structure formed in accordance with the method of the present invention.

As shown in the drawing for purposes of illustration, the present invention is concerned with semiconductor fabrications techniques and, in particular, with a fabrication method that facilitates the use of Group III-V semiconductor materials in structures that include dielectric layers. Group III-V materials have important applications in high-speed semiconductor structures, such as heterojunction bipolar transistors (HBTs), high electron mobility transistors (HEMTs), and various electro-optical devices. As discussed above, Group III-V semiconductor materials in general have undesirable electrical and morphology properties that render them difficult to work with in structures that include dielectric layers.

In accordance with the present invention, before a Group III-V material is regrown over a semiconductor structure, an intermediate layer, or seed layer, is first grown. The intermediate layer is selected to have a relatively smooth morphology, which results in improved morphology and electrical properties in the final layer grown over the intermediate layer. In effect, the intermediate layer improves and enables desirable growth properties of the final layer.

As shown in FIG. 1, the invention applies to a semiconductor structure that includes a substrate, indicated by reference numeral 10. The substrate 10 may not necessarily be the lowermost layer in the structure, but may be, for example, the base region of a heterojunction bipolar transistor (HBT). By way of specific example, the substrate 10 may be an indium gallium arsenide (InGaAs) base. As a result of processing steps performed during fabrication, the semiconductor structure further includes at least one layer 12 of dielectric material formed over the substrate 10. The dielectric layer 12 may be, for example silicon oxide ($SiO_x$) or silicon nitride ($SiN_x$). While the thickness of the dielectric layer 12 is not important to the invention, a typical thickness is in the range 10 nm to 1000 nm.

In many applications of semiconductors, there is a need to establish electrical contact with a semiconductor region, such as with the substrate 10 acting as the base of the transistor. It is sometimes impractical to apply a metal contact layer directly to the region with which contact is to be made, because such a metal-semiconductor junction would not have desirable electrical properties. Therefore, there is a need to apply a regrowth layer of Group III–V material over the substrate 10, and to establish electrical contact through this regrowth layer. As discussed above, this approach is difficult to accomplish with Group III–V materials because the regrowth layer typically does not have desirable electrical and morphology properties.

Figure 2:
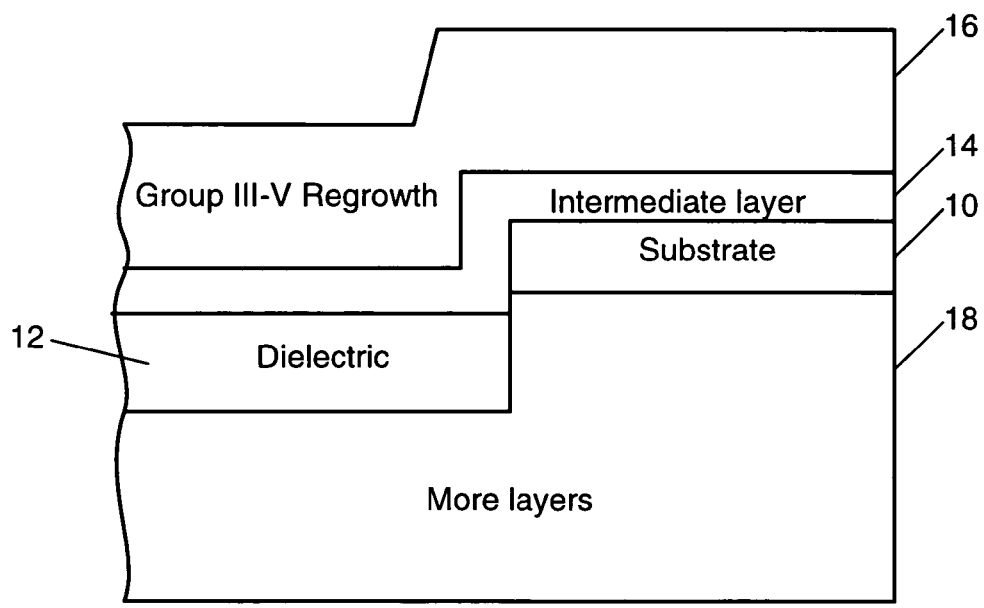
FIG. 2 is cross-sectional diagram similar to FIG. 1, but showing an alternate form of the structure.

In the present invention, an intermediate layer 14 is first formed over the substrate 10 and the dielectric layer 12. The intermediate layer 14, or seed layer, may be, for example, p-type indium gallium arsenide (InGaAs), n-type indium arsenide (InAs), gallium antimonide (GaSb) or indium antimonide (InSb). The thickness of this layer does not appear to be critical to the invention but a thickness in the range 10 nm to 100 nm is appropriate. The material is selected to provide very smooth morphology. Those portions of the intermediate layer 14 in contact with the dielectric material 12 take a polycrystalline form, while that portions formed directly over the substrate 10 are grown epitaxially over the substrate and are generally monocrystalline. While the substrate 10 and the dielectric layer 12 may be a flat stack as shown in FIG. 1, these layers may also be patterned and contoured. FIG. 2 shows one such possible layer pattern. Therefore, the intermediate layer 14 may have a downward step from the dielectric layer 12 to the substrate 10 as shown in FIG. 1, may be flat, or may have an upward step as shown in FIG. 2.

When a Group III–V regrowth layer 16 is formed over the intermediate layer 14, the presence of the intermediate layer improves the electrical and morphology properties of the regrowth layer. The region of the regrowth layer 16 that is not over the dielectric layer 12 takes a monocrystalline form from the underlying intermediate layer, and this region provides good low-resistance contact with the substrate 10. The region of the regrowth layer 16 that is directly over the dielectric layer 12 generally takes a polycrystalline form. By way of example only, the regrowth layer may be a Group III–V layer, such as p-type indium antimonide (InSb) of suitable thickness, such as 200 nm. Typically, a metal layer (not shown) is formed over portions of the regrowth layer 16 to establish electrical contact with the substrate 10 or base, and with other selected regions of the semiconductor substrate.

In the foregoing description, the steps of forming or growing semiconductor layers are performed by an appropriate epitaxial process, such as molecular beam epitaxy (MBE).

It will be appreciated from the foregoing that the present invention represents a significant improvement in the art of semiconductor fabrication using Group III–V materials. In particular, the use of an intermediate or seed layer of smooth morphology improves the properties of a subsequently applied Group III–V regrowth layer. This improvement permits the fabrication of a variety of semiconductor structures that make use of the desirable properties of Group III–V materials. It will also be appreciated that, although a specific embodiment of the invention has been described in detail, various modifications may be made that are within the spirit and scope of the invention. Accordingly, the invention should not be limited except as by the appended claims.

The invention claimed is:

1. A method for fabricating a Group III–V semiconductor structure, comprising the following steps performed in the order in which they are recited:
    forming a substrate;
    forming a dielectric layer over at least one selected protion of the substrate;
    forming an intermediate layer over the dielectric layer and still exposed portions of the substrate, wherein the intermediate layer is selected for its smooth morphology properties; and
    forming a Group III–V regrowth layer over the intermedate layer, wherein this step is facilitated by the presence of the intermediate layer.

2. A method as defined in claim 1, wherein:
    the substrate is a Group III–V semiconductor material.

3. A method as defined in claim 1, wherein:
    the step of forming an intermediate layer comprises selecting a Group III–V semiconductor material for the intermediate layer.

4. A method as defined in claim 3, wherein:
    the intermediate layer is selected from the group consisting of Indium gallium arsenide (InGeAs), indium arsenide (InAs), gallium antimonide (GaSb) and indium antimonide (InSb).

5. A method as defined in claim 4, wherein:
    the Group III–V regrowth layer is of p-type indium antimonide (InSb).

6. A method as defined in claim 1, wherein the steps of forming semiconductor layers are effected by molecular beam epitaxy (MBE).

* * * * *